(12) United States Patent
Amir et al.

(10) Patent No.: US 7,538,440 B2
(45) Date of Patent: May 26, 2009

(54) METHOD FOR IMPROVED HIGH CURRENT COMPONENT INTERCONNECTIONS

(75) Inventors: Dudi I. Amir, Portland, OR (US); Damion T. Searls, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 388 days.

(21) Appl. No.: 10/427,681

(22) Filed: Apr. 30, 2003

(65) Prior Publication Data

US 2004/0216917 A1    Nov. 4, 2004

(51) Int. Cl.
*H01L 23/48* (2006.01)
(52) U.S. Cl. .................. 257/778; 257/779; 257/780; 174/261; 361/760; 361/761; 361/767
(58) Field of Classification Search .................. 428/209; 257/777–781; 361/774, 760, 761, 767; 174/260, 174/261
See application file for complete search history.

(56) References Cited

U.S. PATENT DOCUMENTS

| | | | | |
|---|---|---|---|---|
| 4,878,611 A | * | 11/1989 | LoVasco et al. | ........ 228/180.22 |
| 5,275,330 A | | 1/1994 | Isaacs et al. | |
| 5,346,118 A | * | 9/1994 | Degani et al. | .......... 228/180.22 |
| 5,523,920 A | * | 6/1996 | Machuga et al. | ............. 361/767 |
| 5,796,590 A | | 8/1998 | Klein | |
| 5,847,936 A | | 12/1998 | Forehand et al. | |
| 5,930,889 A | * | 8/1999 | Klein | .......... 29/840 |
| 5,956,606 A | | 9/1999 | Burnette | |
| 6,018,197 A | * | 1/2000 | Saiki et al. | ................... 257/784 |
| 6,093,964 A | * | 7/2000 | Saitoh | ........................ 257/738 |
| 6,165,885 A | * | 12/2000 | Gaynes et al. | .............. 438/612 |
| 6,319,810 B1 | | 11/2001 | Ochiai et al. | |

(Continued)

FOREIGN PATENT DOCUMENTS

JP         07-038246        2/1995

OTHER PUBLICATIONS

U.S. Appl. No. 10/192,346, filed Jul. 10, 2002, "Selective Area Solder Placement", 13 pages including Figures.

(Continued)

*Primary Examiner*—Cathy Lam
(74) *Attorney, Agent, or Firm*—Blakely, Sokoloff, Taylor & Zafman LLP

(57) ABSTRACT

A printed circuit board having at least one conductive region covered in solder paste has preformed solder elements placed on the solder paste in the conductive region. A component package is placed onto the printed circuit board over the conductive region and the solder is reflowed, forming a wide solder interconnection between the component and the conductive region of the printed circuit board.

4 Claims, 10 Drawing Sheets

U.S. PATENT DOCUMENTS

| | | | |
|---|---|---|---|
| 6,358,630 B1 * | 3/2002 | Tsukada et al. | 428/646 |
| 6,380,060 B1 | 4/2002 | Zohni | |
| 6,410,415 B1 * | 6/2002 | Estes et al. | 438/612 |
| 6,514,845 B1 | 2/2003 | Eng et al. | |
| 6,548,898 B2 * | 4/2003 | Matsuki et al. | 257/746 |
| 6,697,151 B2 * | 2/2004 | Owen et al. | 356/237.1 |
| 6,713,871 B2 * | 3/2004 | Searls et al. | 257/738 |
| 6,740,577 B2 * | 5/2004 | Jin et al. | 438/612 |
| 6,876,072 B1 * | 4/2005 | Wang et al. | 257/678 |
| 7,109,587 B1 * | 9/2006 | Li | 257/779 |
| 7,129,577 B2 * | 10/2006 | Maxwell | 257/707 |
| 7,138,583 B2 * | 11/2006 | Wallace | 174/260 |
| 7,301,243 B2 * | 11/2007 | Suga et al. | 257/778 |
| 2005/0225953 A1 | 10/2005 | Amir et al. | |

OTHER PUBLICATIONS

U.S. Appl. No. 10/106,283, filed Mar. 26, 2002, "Ganged Land Grid Array Socket Contacts For Improved Power Delivery", 18 pages including Figures.

Dudi I. Amir, "Improved High Current Component Interconnection", U.S. Appl. No. 11/148,535, filed on Jun. 8, 2005. Office Action mailed Jun. 27, 2006. Copy of the Office Action, claims as they stood in the application prior to the mailing of the Office Action.

* cited by examiner

METHOD FOR IMPROVED HIGH CURRENT COMPONENT INTERCONNECTIONS

BACKGROUND OF THE INVENTION

1. Field of the Invention

The present invention relates generally to the field of electronic printed circuit boards, and more specifically to forming solder interconnections on the printed circuit board.

2. Discussion of Related Art

Demands on power delivery have increased as part of the effort to achieve higher performance in logic silicon products. Higher currents, better current transient response and bypass capacitance are frequently the key parameters sought in successful power delivery design. One potential power delivery bottleneck is in the printed circuit board -component interface. For example, a power MOSFET-board interface can introduce a substantial amount series resistance and thereby limit the effectiveness of the power delivery system. Currently, many standard off-the-shelf ball grid array (BGA) MOSFET components use similar interconnect structures for both the power and signal connection even though the electrical and thermal requirements for power and signaling can be different.

FIGS. 1A, 1B, and 1C illustrate an exemplary means of the current art for forming an interconnection between a component in a standard BGA package 102 and a printed circuit board 100. FIG. 1A illustrates a top view of a printed circuit board 100 with component 102 positioned above it. The printed circuit board conductive planes 106 extend underneath the BGA component package 102. The conductive planes may be either power or ground planes. These planes are covered by an array of individual solder paste pads 108. The printed circuit board also contains signal traces 105 that are each connected to a conductive pad covered with solder paste 108. Individual solder balls 120 from the BGA component package 102 form the connection between the pads and the component for both the signal interconnections and the conductive plane interconnections.

FIG. 1B illustrates a side view of component 102 positioned over printed circuit board 100. Component solder balls 120 are positioned over solder paste pads 108, connecting component solder balls 120 to signal pads 104 and conductive plane 106. Solder mask 101 protects areas of the printed circuit board that are not to be covered by solder.

FIG. 1C illustrates the component 102 and printed circuit board 100 of FIG. 1B after the component solder balls 120 and solder paste 108 have been reflowed to form an electrical interconnection 122. Although the component standoff 126 created by this method may be adequate, the electrical interconnection between the component 102 and the printed circuit board is quite narrow in the conductive plane region 106.

The relatively low volume solder ball of the BGA limits the size of the component-power plane interface. The smaller interconnects 122 formed using the prior art method limit current to the component. These smaller interconnects are highly resistive, and can limit the effectiveness of the power delivery system. In addition, the resulting high current density can result in excessive parasitic inductance. It is advantageous to remove this bottleneck by widening the power interface. A wider power interface has several advantages, including reduced resistance and increased heat transfer between the package and the printed circuit board. Though a wider power interface is desired, it is also advantageous to avoid altering the design of a commodity product like a MOSFET.

As illustrated in FIGS. 2A and 2B, a wider conductive interconnection may be formed on the printed circuit board by replacing an array of solder paste pads over a conductive region with a larger region of solder paste 109. This may not provide for an optimal solder interconnection, however. Solder paste 108 covers signal pads 104, forming an interconnection 122 between the signal pads and the component solder balls after solder reflow. Solder paste region 109 covers conductive plane 106, forming an interconnection 123 between the conductive plane and the component solder balls after solder reflow. As illustrated in FIG. 2B, the volume of solder provided by solder paste region 109 and solder balls 120 may not be sufficient to entirely fill the solder interconnection area 123 after solder reflow. Solder voids 124 and solder separation will result from insufficient solder volume. Furthermore, the resulting component standoff 126 will be less than the desired standoff when an inadequate amount of solder is used in forming interconnections.

In some cases, additional solder volume can be provided by the component, either by adding additional solder balls to the component, or by using larger solder balls on the component. However, this requires a change in product design by the component vendor to accommodate the additional solder on the component package.

FIGS. 3A and 3B illustrate an exemplary means of the current art for providing a wider power interface between the component and the printed circuit board. FIG. 3A illustrates a bottom view of a standard component package 102 containing no solder. Conductive pads 121 and signal pad 122 are located on the bottom of component package 102.

FIG. 3B illustrates the interconnect formed between package 102 and printed circuit board 100 after the conductive pads of the component are placed onto a layer of solder paste and the solder paste is reflowed. After reflow, solder interconnections 123 are formed between conductive pads 121 and conductive planes 106, and between conductive signal pad 122 and signal pad 104. The component package 102 contains no solder on either conductive pads 121 or signal pad 122, so the manufacturer must rely on solder paste alone to make up the entire solder volume of the solder interconnect between the component and the printed circuit board. Because of limitations on the amount of solder paste that can practically be applied to the printed circuit board, the solder paste alone provides insufficient solder volume to entirely fill the solder interconnections 123. Solder separation may occur, or solder voids 124 may be formed with the solder interconnections 123. Furthermore, the component standoff 126 formed by this method is less than the ideal component standoff. To avoid these problems, additional solder volume must be added to the solder interconnection.

DETAILED DESCRIPTION OF THE PRESENT INVENTION

Embodiments of the present invention provide a method for widening the power delivery interface between the printed circuit board and the component through printed circuit board manufacturing processes alone, and without requiring a re-design of existing components. This is accomplished by placing pre-formed solder elements in selected areas of solder paste where additional solder volume is required.

Figure 4A:
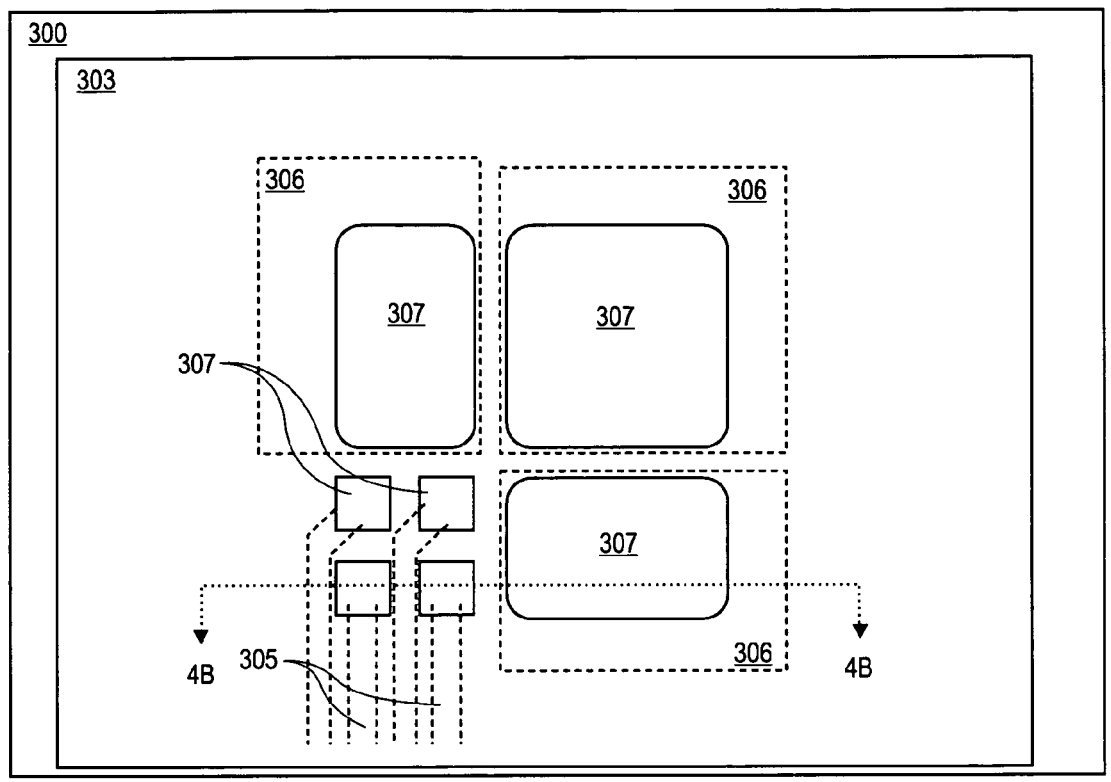
FIG. 4A illustrates a top view of an exemplary printed circuit board and solder paste stencil prior to solder paste application according to one embodiment of the present invention.

FIG. 4A illustrates a top view of a printed circuit board 300 prior to application of solder paste. A solder paste stencil 303 containing apertures 307 is placed over the printed circuit board. The solder paste stencil is positioned over the printed circuit board such that the apertures 307 in the stencil correspond to areas on the printed circuit board where solder paste application is desired. The location of the apertures in the solder paste stencil corresponds to areas on the printed circuit board where there will be an electrical connection to a component. The apertures in the stencil may be positioned over conductive planes 306, over signal pads that are electrically connected to conductive traces 305 on the printed circuit board, or over any other region where electrical interconnections are desired. In one embodiment of the present invention, conductive plane 306 is a power plane.

Figure 4B:
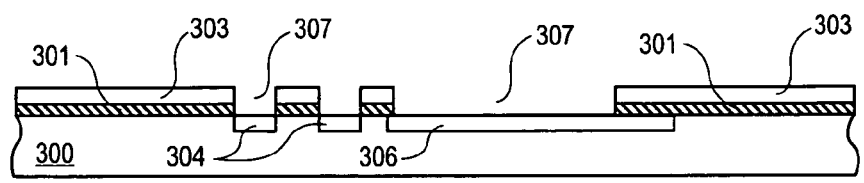
FIG. 4B illustrates a cross-section view of an exemplary printed circuit board and solder paste stencil prior to solder paste application according to one embodiment of the present invention.

FIG. 4B illustrates a cross-section of a printed circuit board 300 prior to application of solder paste. The printed circuit board contains conductive planes 306 as well as conductive signal pads 304 that are to be covered by solder paste. The areas of the board that are not to be covered with solder are protected by solder mask 301. A solder paste stencil 303 containing apertures 307 is used to selectively apply solder paste to the printed circuit board. The solder paste stencil 303 is placed such that solder paste stencil apertures 307 are located over areas where solder paste is to be applied. The thickness of the solder paste to be applied is limited by the stencil thickness as well as by the small size of features such as traces and pads on the printed circuit board.

In one embodiment of the present invention, the conductive planes 306 and the conductive signal pads 304 are copper.

Figure 1A:
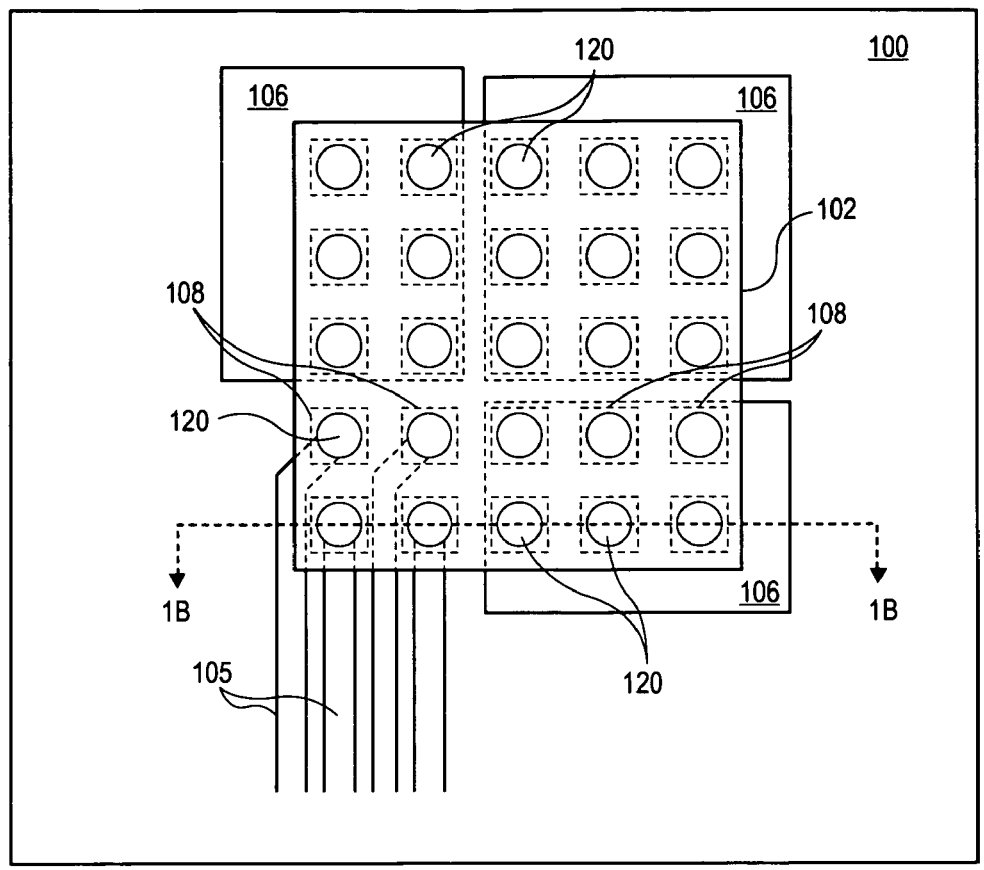
FIGS. 1A, 1B, and 1C illustrate a prior art method for forming an interconnection between a standard BGA component and a printed circuit board.
Figure 1B:
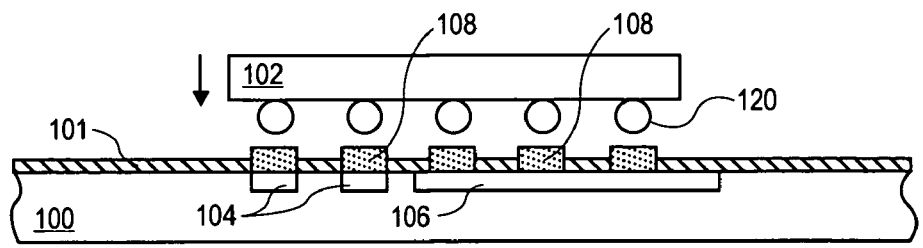
Figure 1C:
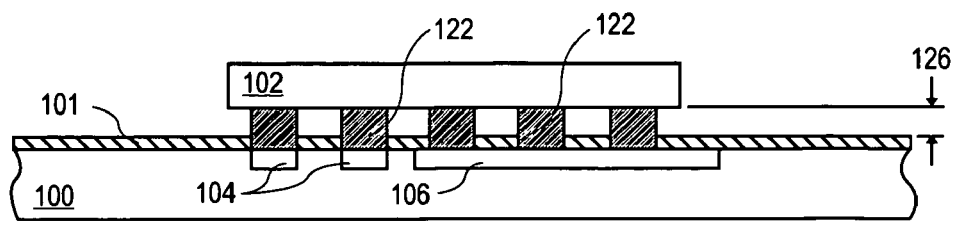
Figure 2A:
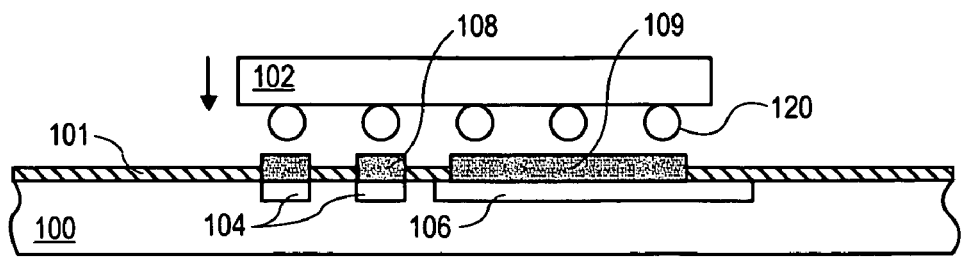
FIGS. 2A and 2B illustrate problems associated with forming an interconnection between a standard BGA component and a printed circuit board having a widened power interface.
Figure 2B:
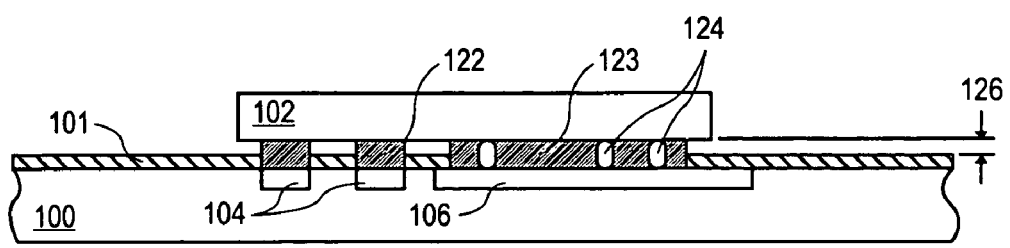
Figure 5A:
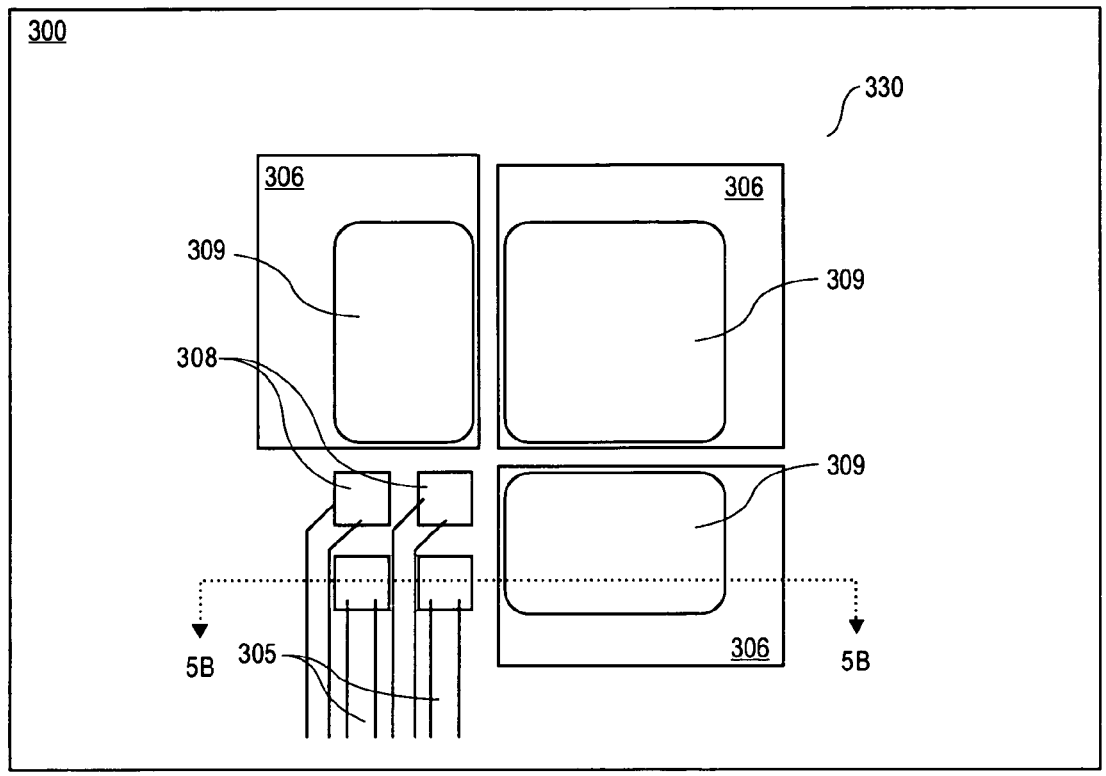
FIG. 5A illustrates a top view of an exemplary printed circuit board after solder paste application according to one embodiment of the present invention.

FIG. 5A illustrates a top view of the component attach region 330 of the printed circuit board 300 of FIG. 3 after application of solder paste. Solder paste is printed over both the signal pads and the conductive planes 306. The individual signal pads are each covered by areas of solder paste 308, while the conductive regions 306 are covered by a larger region of solder paste 309. The large region of solder paste 309 of FIG. 5A replaces an array of one or more individual solder pads 108 on a conductive plane, as shown in FIG. 1A. Solder paste region 309 is placed in a region on a conductive plane where an electrical connection is desired. Replacing an array of individual pads in a conductive plane with a larger conductive region 309 widens the solder interface to the printed circuit board. The signal pads that are connected to traces 305 are printed with solder paste 308 and remain substantially equivalent to the signal pads printed with solder paste 108 of FIG. 1A.

Figure 5B:
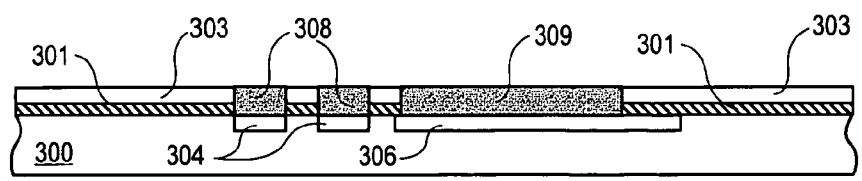
FIG. 5B illustrates a cross-section view of an exemplary printed circuit board after solder paste application according to one embodiment of the present invention.

FIG. 5B illustrates a cross-section of printed circuit board 300 after solder paste is applied through apertures in a solder paste stencil 303. Solder paste is applied to signal pads 304 and to conductive region 306. Regions of solder paste 308 are formed over each of the signal pads 304. Regions of solder paste 309 are formed over each of the conductive regions of the printed circuit board 306. In one embodiment of the present invention, a solder paste region 309 formed over a conductive region of the printed circuit board is larger than a solder paste region 308 formed over a signal pad on a printed circuit board.

Figure 6A:
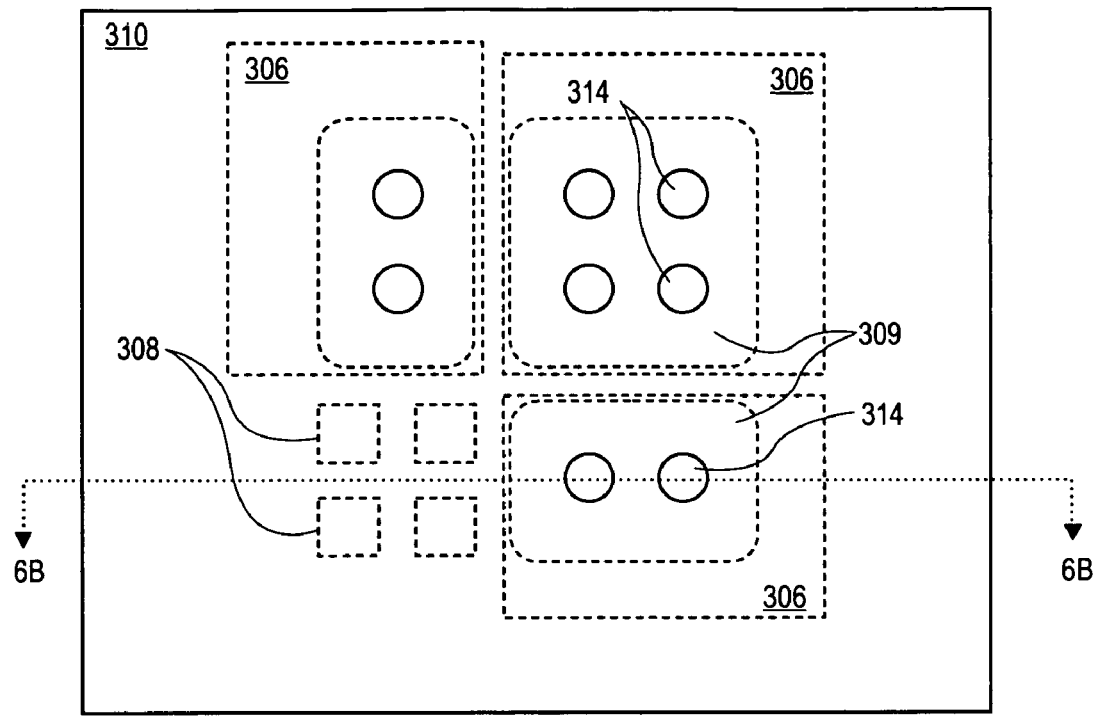
FIG. 6A illustrates a top view of an exemplary printed circuit board and bonus solder ball stencil according to one embodiment of the present invention.

FIG. 6A illustrates a top view of a second stencil 310 placed over the printed circuit board. The stencil 310 contains openings, or apertures, 314. In one embodiment of the present invention, the apertures 314 in the second stencil are located in an area where additional solder volume is desired. In another embodiment of the present invention, the apertures 314 in the second stencil are located over an area on the printed circuit board containing a conductive plane 306. In yet another embodiment of the present invention, the location of the apertures 314 in the second stencil corresponds to the interstices of the component package solder balls.

Figure 6B:
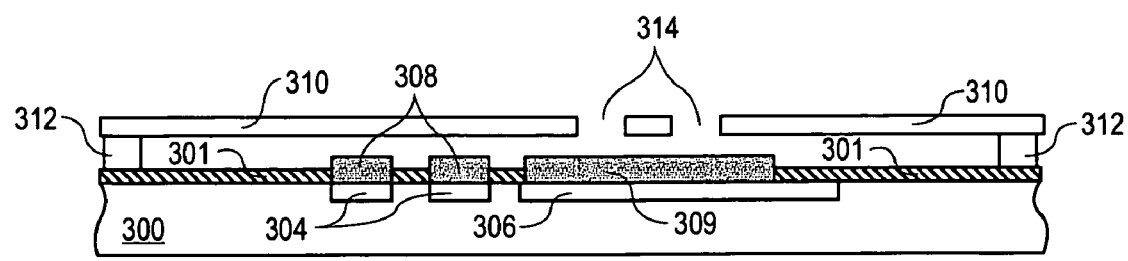
FIG. 6B illustrates a cross-section view of an exemplary bonus solder ball stencil according to one embodiment of the present invention.

FIG. 6B illustrates a cross section of a second stencil 310 placed over the printed circuit board 300. Spacers 312 are placed between the stencil and the printed circuit board to prevent the stencil from interfering with the solder paste. The stencil 310 contains openings, or apertures, 314 through which one or more pre-formed solder elements are placed onto a region of solder paste. The second stencil is used to place pre-formed solder elements directly onto the printed circuit board in a pre-determined location. The addition of pre-formed solder elements to the printed circuit board increases the solder volume on the printed circuit board in the area where the pre-formed solder elements are placed. Pre-formed solder elements that may be used include spherical solder balls, rectangular or cubic solder elements, or a solder element formed into any other solid shape. In one embodiment of the present invention, the pre-formed solder elements are composed of a combination of lead and tin. In another embodiment of the present invention, the pre-formed solder elements are lead-free, and are composed primarily of tin. In one embodiment of the present invention, the pre-formed solder elements are solder balls. In one embodiment of the present invention, solder balls or other pre-formed solder elements are placed onto the top of the stencil and a squeegee is used to push the solder elements along the surface. When a solder element is pushed to a stencil aperture, it will drop through the aperture, contact the underlying solder paste and remain stuck in place in the solder paste. In another embodiment of the present invention, solder balls or other pre-formed solder elements are placed onto the top of the stencil and the stencil is shaken until each of the solder elements drops through a stencil aperture, contacts the underlying solder paste, and is stuck in place in the solder paste. Through this process, additional solder balls or other solder elements are effectively pasted directly onto the printed circuit board.

Figure 7:
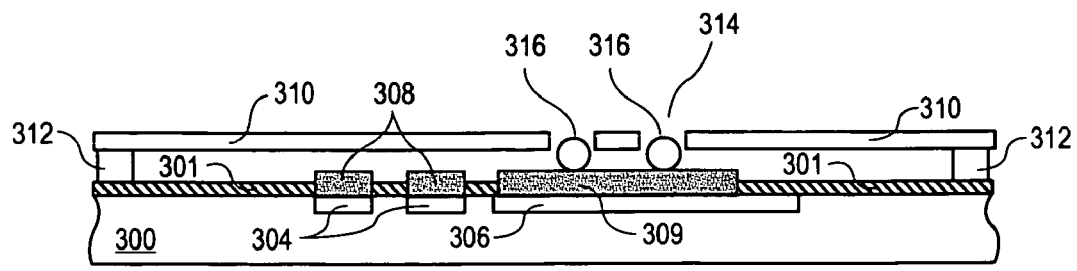
FIG. 7 illustrates a cross-section view of an exemplary printed circuit board and bonus solder ball stencil after placing additional solder balls onto the solder paste according to one embodiment of the present invention.

FIG. 7 illustrates a cross-section of printed circuit board 300 after solder balls, or "bonus" solder balls 316, have been placed directly onto solder paste region 309 through the apertures 314 in the second stencil 310. The solder balls will remain stuck in place in solder paste 309. These bonus solder balls 316, or other pre-formed solder elements, add additional solder volume to the solder interconnection after the solder has been reflowed. In one embodiment of the present invention, no additional solder elements have been placed onto the solder paste 308 covering signal pads 304. In another embodiment of the present invention, additional solder elements are placed onto an area of solder paste where additional solder volume is desired. In yet another embodiment of the present invention, additional solder elements are placed onto high power regions of the printed circuit board.

Figure 8A:
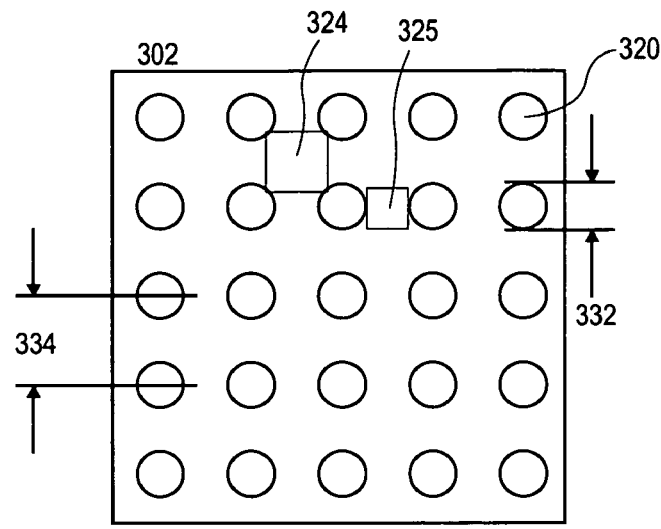
FIGS. 8A and 8B illustrate a bottom view of exemplary standard component packages according to embodiments of the present invention.
Figure 8B:
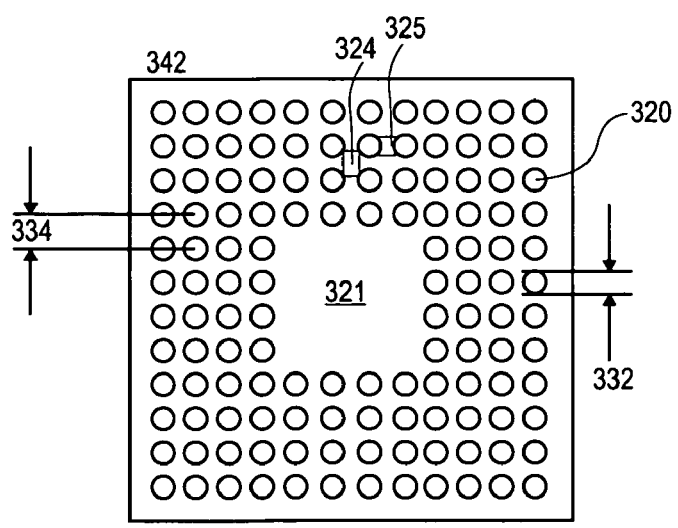

FIGS. 8A and 8B illustrate a bottom view of exemplary standard component packages. FIG. 8A illustrates a bottom view of a standard BGA component package 302 that is fuiiy populated with solder balls 320. The solder balls on component package 302 are equally distributed across the entire package. FIG. 8B illustrates a bottom view of another type of standard BGA component package 342 that is populated with solder balls 320 around the periphery of the package and has an open center cavity 321. The array of solder balls on component package 342 is located around the periphery of the package. Both component packages 302 and 342 are populated with solder balls 320. All conductive pads on the package that will be connected to the printed circuit board are associated with a component solder ball 320. The solder ball pitch 334 and solder ball diameter 332 are consistent across all balls on the package. A region interstitial to the component solder balls is indicated by hatched region 324. A region between the component solder balls is indicated by hatched region 325.

Standard component packages are available in a wide variety of configurations. The array of solder balls on a component package in an embodiment of the present invention need not be identical to the arrays of solder balls shown in FIG. 8A or 8B. In one embodiment of the present invention, the component package is an unmodified, off-the-shelf package that is fully populated with solder balls. In another embodiment of the present invention, the component package is an unmodified, off-the-shelf package that is populated with solder balls around the periphery of the component package and having an open center cavity. In yet another embodiment of the present invention, the solder balls are equally sized and consistently spaced on the component package, and have a constant ball pitch.

Figure 9A:
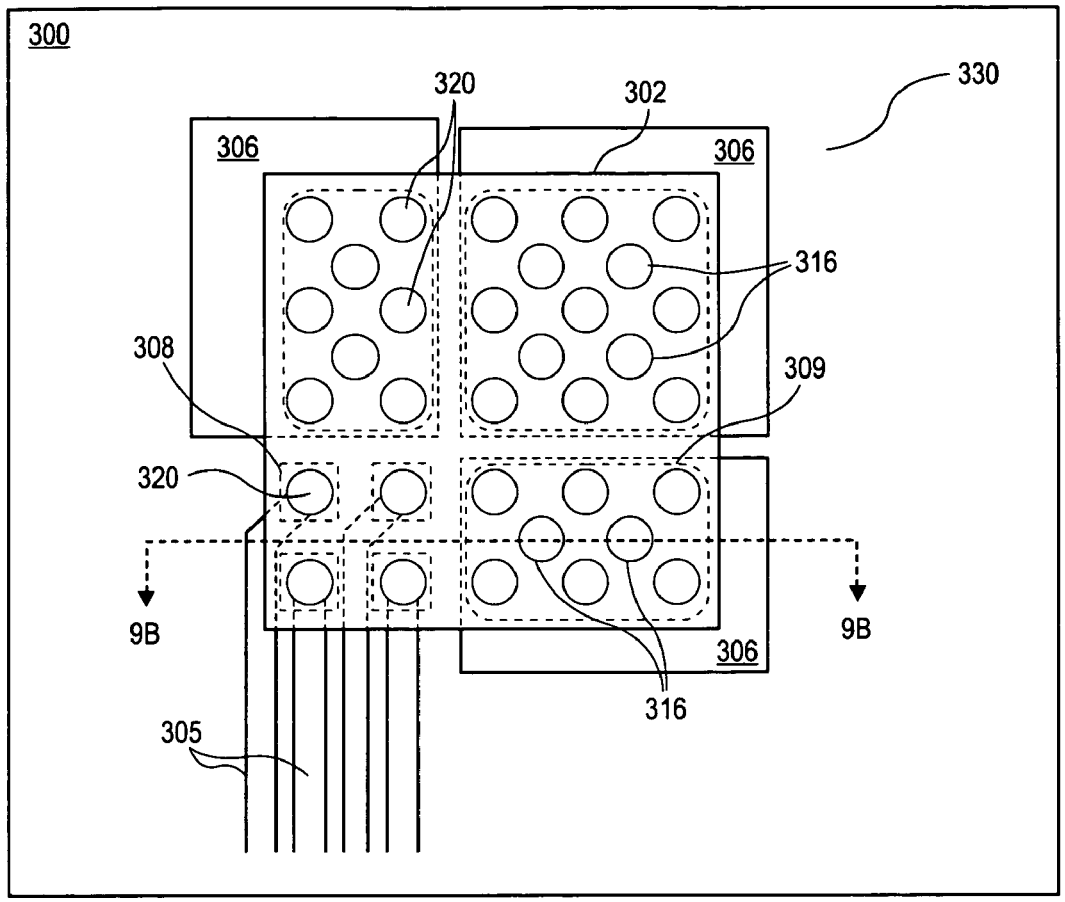
FIG. 9A illustrates a top view of an exemplary printed circuit board and component according to one embodiment of the present invention.

FIG. 9A illustrates a top view of the placement of a component package 302 onto a printed circuit board in the component attach region 330 prior to solder reflow. In one embodiment of the present invention, the component package 302 is placed over large solder paste regions 309 which are on conductive planes 306, such that the bonus solder balls 316 are located interstitial to the component package solder balls 320. The component package 302 is also placed such that some of the component solder balls 320 are aligned with solder regions 308 that are connected to signal traces 305.

Figure 9B:
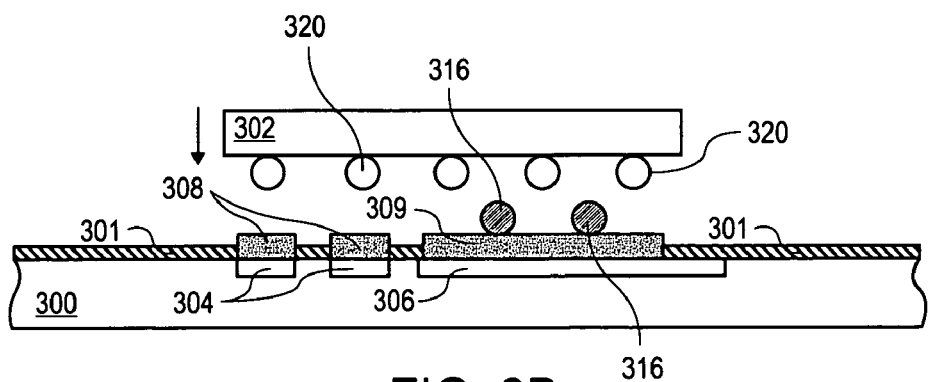
FIG. 9B illustrates a cross-section view of an exemplary printed circuit board, including solder paste and solder balls, and placement of a component with component solder balls onto the printed circuit board according to one embodiment of the present invention.

FIG. 9B illustrates a cross-section of the placement of component package 302 onto printed circuit board 300. The component package 302 is positioned over the printed circuit board such that at least some of the component solder balls 320 are positioned over large solder paste regions 309 located over conductive planes 306. At least some of the component solder balls 320 are positioned over signal pads 304. In one embodiment of the present invention, the component package 302 is positioned such that the bonus solder balls 316 are located interstitial to the component package solder balls 320. In another embodiment of the present invention, the component package 302 is positioned such that the solder balls 316 are located between the component package solder balls 320.

Figure 10A:
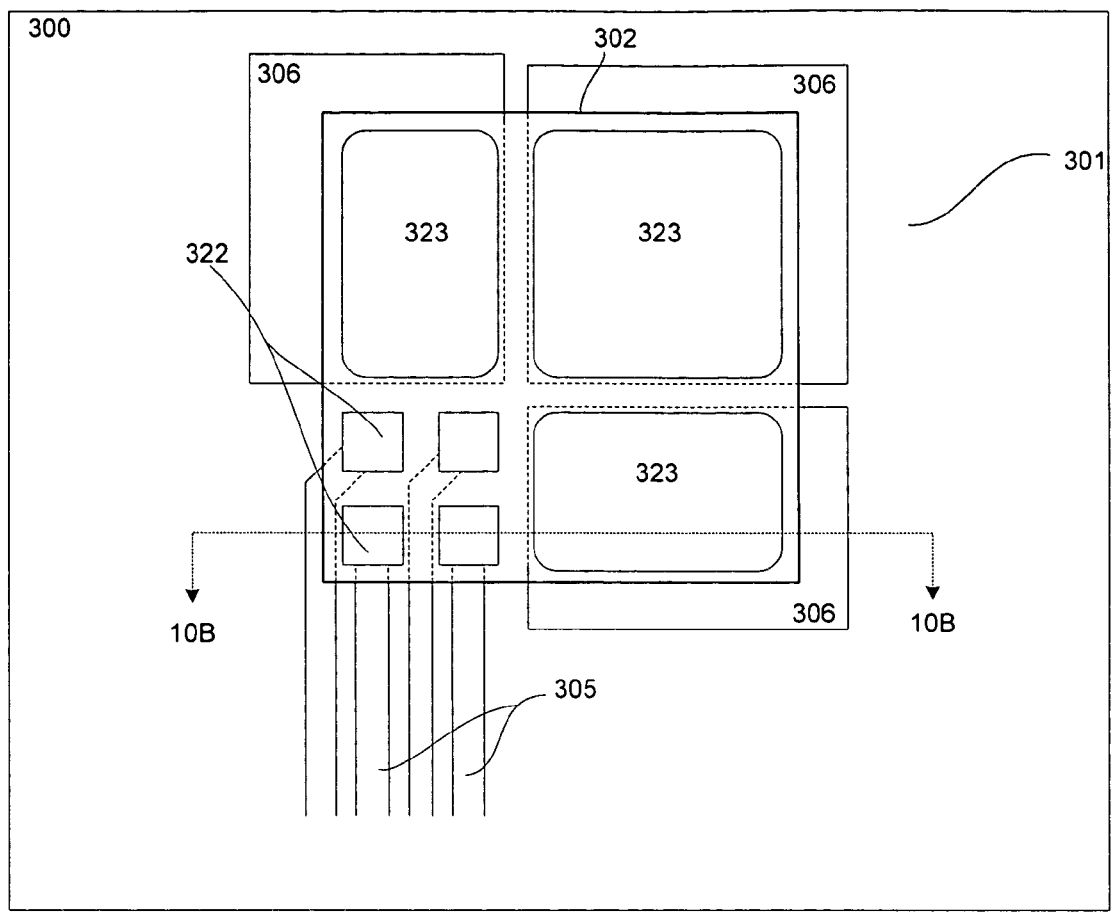
FIG. 10A illustrates a top view of an exemplary solder interconnection between a component package and a printed circuit board according to one embodiment of the present invention.

FIG. 10A illustrates a top view of the solder interconnections 322 and 323 formed after the solder paste, component solder balls, and bonus solder balls have undergone a solder reflow process. During reflow, the assembly is placed in a reflow oven, where the individual solder balls on the component package and on the printed circuit board and the solder paste on the printed circuit board will melt and flow together. Solder reflow typically occurs at temperatures near 220C, however this may vary somewhat based on the solder composition and the printed circuit board design. The solder interconnections 323 between the conductive planes 306 and the component 302 are widened, while the solder interconnections 322 between the individual signal pads and the component 302 remain substantially similar to those formed by a prior art method.

Figure 10B:
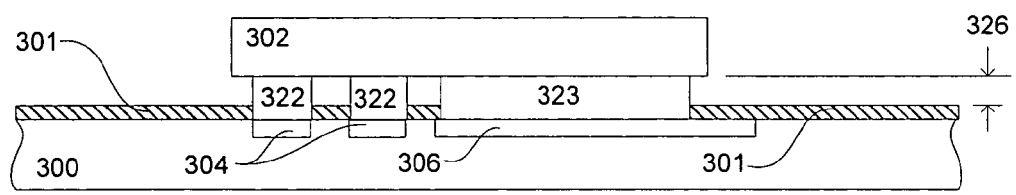
FIG. 10B illustrates a cross-section view of an exemplary solder interconnection between a component package and a printed circuit board according to one embodiment of the present invention.

FIG. 10B illustrates a cross-section of solder interconnections 322 and 323 formed after the solder paste and solder balls have undergone a reflow process. After reflow, solder interconnections 322 and 323 electrically and mechanically connect component package 302 with signal pads 304 and conductive planes 306, respectively. The solder interconnections formed by this method contain a sufficient amount of solder such that no solder voids exist in the solder interconnection. Furthermore, the component standoff 326 created by this method is adequate because of the additional volume of solder added by placing solder elements directly onto the printed circuit board prior to component placement.

Figure 3A:
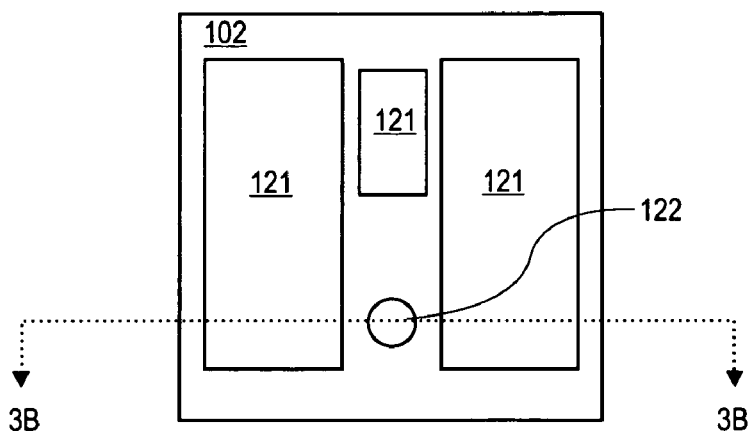
FIGS. 3A and 3B illustrate a prior art method for widening the power interconnection between a component and a printed circuit board, wherein the component package contains no solder.
Figure 3B:
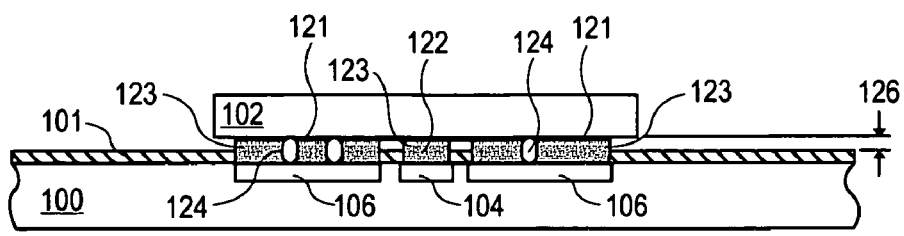
Figure 11A:
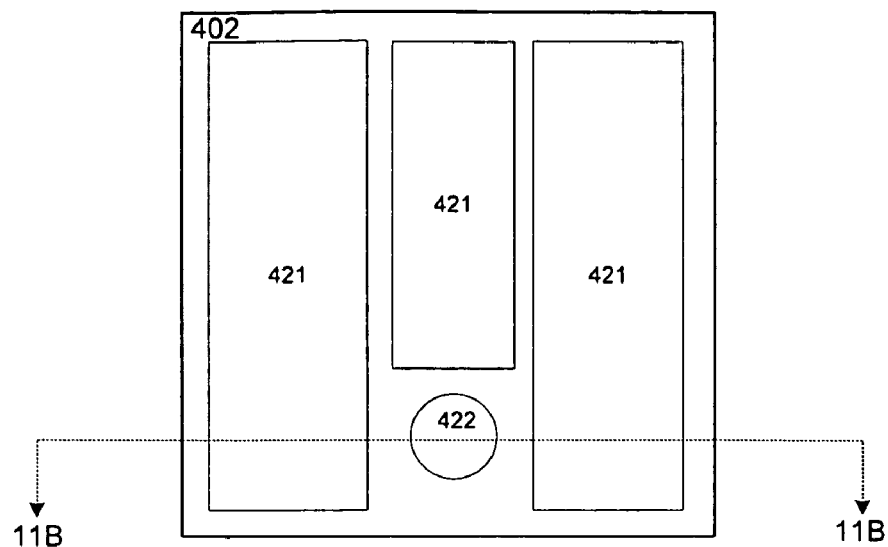
FIGS. 11A, 11B, and 11C illustrate an embodiment of the present invention using a standard component package having only conductive pads and no solder on the package.

FIG. 11A illustrates a bottom view of a component used in one embodiment of the present invention. Component package 402 is a standard package containing no solder. Conductive pads 421 and 422 are located on the bottom of component package 402. In one embodiment of the present invention, the component package is a package having conductive pads, but containing no solder or solder balls. Component package 402 is typically connected to a printed circuit board using only the volume solder provided by the solder paste, as shown in FIGS. 3A and 3B. The volume of solder provided by solder paste alone is sometimes insufficient to form a reliable solder interconnect, as illustrated in FIG. 3B.

Figure 11B:
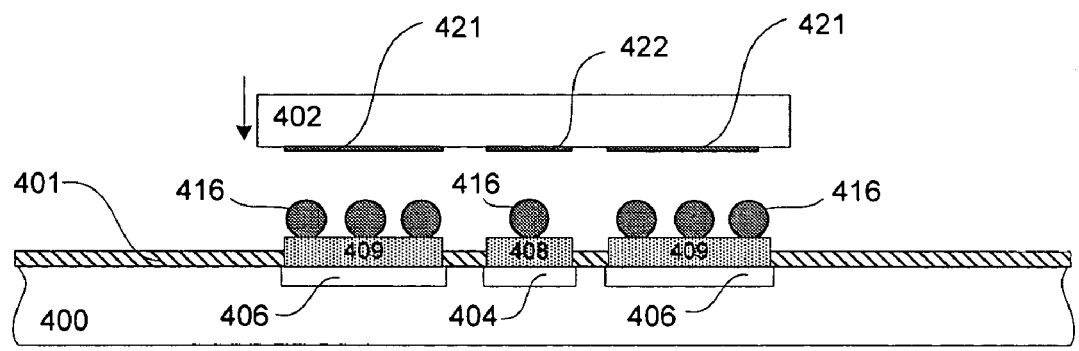

FIG. 11B illustrates the addition of solder elements to the printed circuit board in one embodiment of the present invention. Solder paste 408 and 409 is printed over signal pad 404 and conductive regions 406, respectively. Solder mask 401 protects areas of the printed circuit board where solder is not desired. Because the component package 402 contains no solder on either conductive pads 421 or signal pad 422, and because the volume of solder provided by the solder paste 408 and 409 is insufficient, additional solder elements 416 are placed onto the printed circuit board 400 by the method of the present invention. In one embodiment of the present invention, additional solder elements are provided in areas of the printed circuit board where additional solder volume is desired. Component package 402 is positioned over solder paste regions 408 and 409. In one embodiment of the present invention, the component package is positioned such that the conductive pads 421 and 422 of the component package are aligned with the solder paste structures 408 and 409 on the printed circuit board, without regard to the placement of solder balls 416.

Figure 11C:
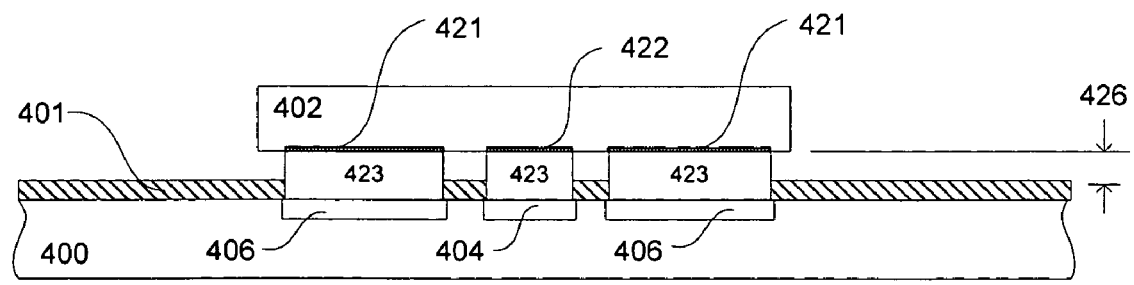

FIG. 11C illustrates the printed circuit board and component package of FIG. 11B after the solder paste and solder balls are reflowed to form solder interconnections 423. Solder interconnections 423 mechanically and electrically connect the component package with conductive planes 406 and signal pad 404 on the printed circuit board. Because additional solder volume has been added to the interconnection, the component standoff 426 is adequate.

Figure 12:
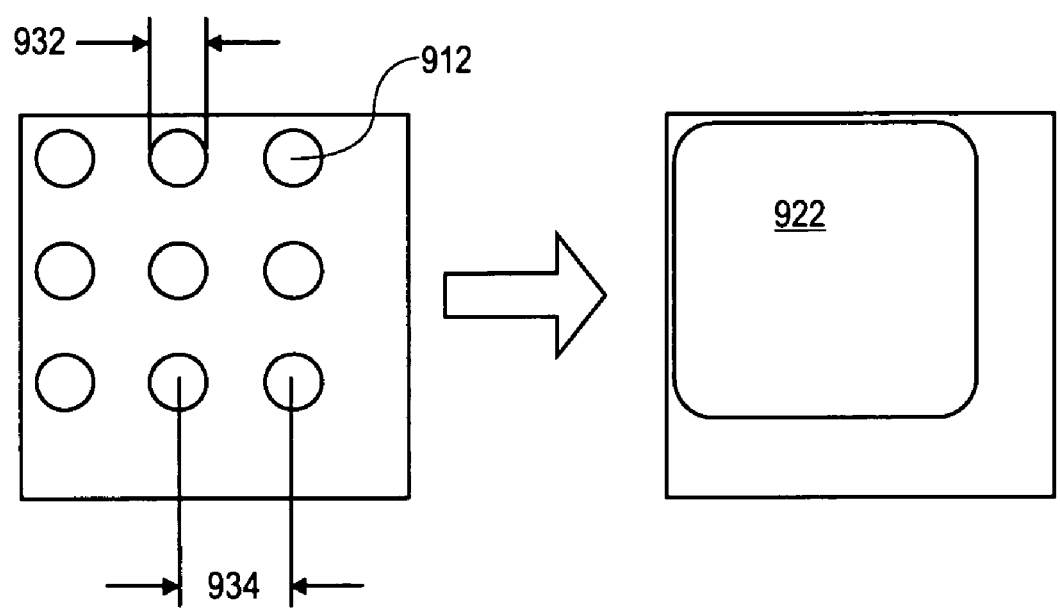
FIG. 12 illustrates an exemplary electrical/thermal conductivity gain according to one embodiment of the present invention.

FIG. 12 illustrates the increase in solder interconnection area formed by this method over that of the prior art method. The increase in solder interconnection area decreases the resistance of the interconnection. This allows a higher current draw by the component. The increased interconnection area also decreases the power density of the interconnect. The percentage improvement in resistance can be calculated by comparing the relative areas of the interconnect structures formed by the prior art method 912 and the interconnect structure formed by the method of the present invention 922. Assuming a ball diameter 932 of 0.5 mm, and a ball pitch 934 of 0.8 mm, the increase in area, and thus the resistance improvement, is roughly 150%. The same increase in metal area is expected to improve the effective heat transfer coefficient between the component and the printed circuit board by approximately 150% as well. Using the method of the present invention it is possible for a printed circuit board to act as a primary heatsink for high-power components such as power MOSFETs or microprocessors.

We claim:

1. An apparatus comprising:
   a printed circuit board including:
      a conductive pad and a conductive plane having a larger surface area than the conductive pad;
      a layer of solder paste applied to the conductive plane and conductive pad;
      a plurality of printed circuit board solder elements in contact with the layer of solder paste applied to the conductive plane and the conductive pad; and
   a component package containing a plurality of consistently spaced component solder elements;
   wherein the component package is placeable onto the layer of solder paste applied to the conductive plane of the printed circuit board such that the plurality of printed circuit board solder elements are located interstitial to the plurality of consistently spaced component solder elements.

2. The apparatus of claim 1 wherein the component package has an open center cavity and a periphery populated with the plurality of consistently spaced component solder elements.

3. An apparatus comprising:
   a printed circuit board including:
      a conductive pad and a conductive plane having a larger surface area than the conductive pad;
      a layer of solder paste applied to the conductive plane and conductive pad;
      a plurality of printed circuit board solder elements in contact with the layer of solder paste applied to the conductive plane and the conductive pad; and
   a component package containing a plurality of consistently spaced component solder elements;
   wherein the component package is placeable onto the layer of solder paste applied to the conductive plane of the printed circuit board such that the plurality of printed circuit board solder elements are located between the plurality of consistently spaced component solder elements.

4. The apparatus of claim 3 wherein the component package has an open center cavity and a periphery populated with the plurality of consistently spaced component solder elements.

* * * * *